(12) United States Patent
Mathia et al.

(10) Patent No.: US 8,581,536 B2
(45) Date of Patent: Nov. 12, 2013

(54) METHOD FOR CONTROLLING THREE SINGLE-PHASE MOTORS AND MOVING A PLATFORM IN A DIRECTION OF THE NORMAL

(75) Inventors: Michel Mathia, Couvet (CH); Claude Froidevaux, La Chaux-de-Fonds (CH); Jacques-André Sudan, Cortaillod (CH)

(73) Assignee: ETEL S.A., Motiers (CH)

( * ) Notice: Subject to any disclaimer, the term of this patent is extended or adjusted under 35 U.S.C. 154(b) by 409 days.

(21) Appl. No.: 13/152,956

(22) Filed: Jun. 3, 2011

(65) Prior Publication Data
US 2011/0304294 A1 Dec. 15, 2011

(30) Foreign Application Priority Data

Jun. 9, 2010 (DE) .......................... 10 2010 023 123

(51) Int. Cl.
*G05B 11/01* (2006.01)
(52) U.S. Cl.
USPC .......................................... 318/560; 318/111

(58) Field of Classification Search
USPC ................ 318/560, 49, 50, 95, 111, 112, 113
See application file for complete search history.

(56) References Cited

U.S. PATENT DOCUMENTS

| 4,638,221 A * | 1/1987 | Brignall .......................... 318/48 |
| 4,742,286 A * | 5/1988 | Phillips .......................... 318/640 |
| 6,208,097 B1 * | 3/2001 | Reddy et al. ..................... 318/52 |
| 6,841,956 B2 | 1/2005 | Hazelton et al. |
| 7,821,221 B2 | 10/2010 | Kragh et al. |

FOREIGN PATENT DOCUMENTS

EP    1 691 476    8/2006

* cited by examiner

*Primary Examiner* — Rina Duda
(74) *Attorney, Agent, or Firm* — Kenyon & Kenyon LLP

(57) ABSTRACT

In a method for controlling three single-phase motors and moving a platform in a direction of the normal, the motors are controlled by one three-phase converter, so that a first motor is operated between a first phase and a second phase of the converter, and a series connection or parallel connection of a second and third motor is operated between a second phase and a third phase of the converter. A platform is adapted to perform this method.

11 Claims, 3 Drawing Sheets

METHOD FOR CONTROLLING THREE SINGLE-PHASE MOTORS AND MOVING A PLATFORM IN A DIRECTION OF THE NORMAL

CROSS-REFERENCE TO RELATED APPLICATIONS

The present application claims priority to Application No. 10 2010 023 123.1, filed in the Federal Republic of Germany on Jun. 9, 2010, which is expressly incorporated herein in its entirety by reference thereto.

FIELD OF THE INVENTION

The present invention relates to a method for controlling three single-phase motors and moving a platform in a direction of the normal, as well as a platform suitable for that purpose. Such platforms are used, for example, to accommodate objects to be processed, such as a wafer. In this context, very precise positioning of the platform is often necessary. Example embodiments of the present invention deal with the fine positioning of such a platform in a direction of the normal.

BACKGROUND INFORMATION

In U.S. Pat. No. 6,841,956, the description regarding FIG. 9 mentions that a platform intended for accommodating a wafer and supported in a manner allowing movement horizontally in the X- and Y-direction, is additionally adjustable by three single-phase motors (voice-coil motors) in a Z-direction, in order to permit exact positioning of the wafer in the Z-direction. The Z-direction is perpendicular to the platform and shall also be denoted here as direction of the normal. The three voice-coil motors all act in the same direction, thus, are able to adjust the platform at its respective point of force or application along the Z-direction.

European Patent No. 1 691 476 describes using a three-phase converter, actually intended to control a three-phase motor, to control a two-phase motor. Among other things, this has the advantage that, as frequently used standard modules, such three-phase converters are available particularly inexpensively.

SUMMARY

Example embodiments of the present invention provide a method for controlling three single-phase motors to position a platform, and example embodiments of the present invention provide a platform.

Example embodiments of the present invention provide a method and a device that permit three single-phase motors, acting in one common direction in order to move a platform in one direction, to be controlled as easily as possible and with low expenditure, in so doing, certain degrees of freedom nevertheless being provided with respect to the control which allow optimal adjustment of the control to the specific demands.

In a method for controlling three single-phase motors and moving a platform in a direction of the normal, the motors are controlled by one three-phase converter so that a first motor is operated between a first phase and a second phase of the converter, and a series connection or parallel connection of a second and third motor is operated between a second phase and a third phase of the converter. A platform, described in more detail below, is suitable for carrying out this method.

As explained in greater detail below, a relatively simple closed-loop control structure may be provided using this method and for such a platform, which on one hand, has the parameterization capability necessary for a stable closed-loop control, but on the other hand, may be provided cost-effectively by the use of a conventional three-phase converter.

According to an example embodiment of the present invention, a method for controlling three single-phase motors and moving a platform in a direction of a normal includes: controlling the motors by a three-phase converter, which, in turn, includes: operating a first motor between a first phase and a second phase of the converter; and operating at least one of (a) a series connection and (b) a parallel connection of a second motor and a third motor between the second phase and a third phase of the converter.

The method may further include: forming a first setpoint current for the first motor; and forming a second setpoint current for the second motor and the third motor.

A common current setpoint value predefined for all three motors may determine a total force resulting from the three motors.

The common current setpoint value may be converted into the first setpoint current and the second setpoint current to shift an area of application of the resulting force of the three motors in a direction of a position-measuring device by which a position of the platform in the direction of the normal is monitored.

The setpoint current of the first motor may be twice as far away, in terms of absolute value, from the current setpoint value as the setpoint current for the second motor and the third motor.

With a parameter K from at least one of (a) an interval [−1; 1] and (b) the interval [−0.5; 0.5], the following may apply for the first setpoint current and second setpoint current for a series connection of the first motor and the second motor:

$$I_1 = I_{setpoint} * (1 + 2*K)$$

and $$I_{23} = I_{setpoint} * (1 - K);$$

$I_1$ representing the first setpoint current;
$I_{23}$ representing the second setpoint current; and
$I_{setpoint}$ representing the current setpoint value.

With a parameter K from at least one of (a) an interval [−1; 1] and (b) the interval [−0.5; 0.5], the following may apply for the first setpoint current and second setpoint current for a parallel connection of the first motor and the second motor:

$$I_1 = I_{setpoint} * (1 + K)$$

and $$I_{23} = I_{setpoint} * (2 - K);$$

$I_1$ representing the first setpoint current;
$I_{23}$ representing the second setpoint current; and
$I_{setpoint}$ representing the current setpoint value.

The method may further include, based on the first setpoint current and the second setpoint current, forming, by a first current controller and a second current controller, a first setpoint voltage and a second setpoint voltage, respectively, that are to be applied to the first motor and to the at least one of (a) the series connection and (b) the parallel connection of the second motor and third motors to obtain a respective setpoint current.

The setpoint voltages may be used for control by the three-phase converter, so that the setpoint voltage for the first motor is between the first phase and the second phase, and the setpoint voltage for the series connection of the second motor and the third motor is between the third phase and the second phase.

According to an example embodiment of the present invention, a system includes: three single-phase motors; a platform adjustable in a direction of a normal by the three single-phase motors; and a three-phase converter. A first motor is connected between a first phase and a second phase of the converter, and a second motor and a third motor are connected at least one of (a) in series and (b) in parallel between the second phase and a third phase of the converter.

The system may further include a single position-measurement device adapted to detect a position of the platform in the direction of the normal Further features and aspects of example embodiments of the present invention are described in more detail below with reference to the appended Figures.

DETAILED DESCRIPTION

Figure 1:
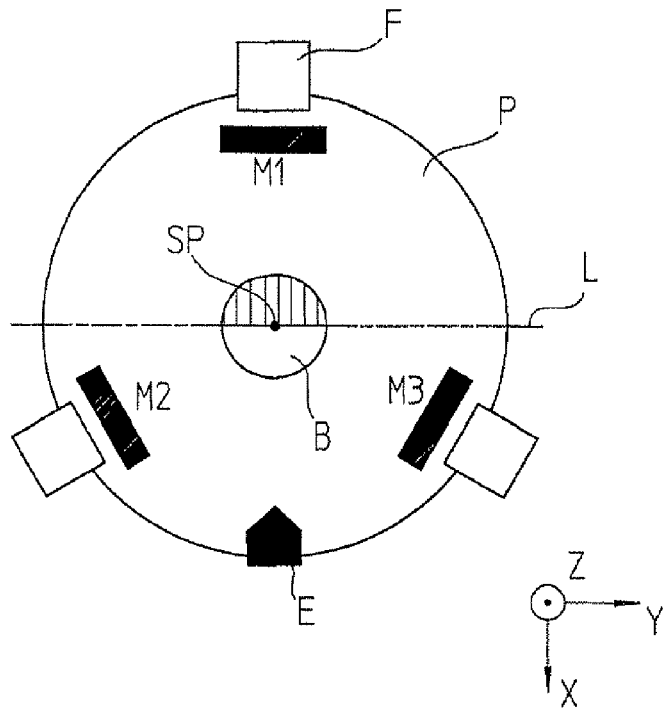
FIGS. 1 and 2 show a platform with three single-phase motors.

FIG. 1 shows a platform P which is supported by three leaf springs F in a manner allowing movement in a Z-direction. The Z-direction is perpendicular to platform P and is also denoted here as direction of the normal Z. Movements in other linear and rotary degrees of freedom are blocked by leaf springs F.

Platform P is adjustable in direction of the normal Z by three motors M1, M2, M3. Motors M1, M2, M3 are single-phase motors, which are distributed uniformly at the periphery of platform P. For example, voice coil motors are suitable, which in each case are constructed of one coil in a permanent magnetic field. The magnetic field and coil axis are parallel to the Z-direction, so that a force proportional to the current intensity is generated in this direction when a current flows through the coil. The direction of the current in the coil determines whether the force acts in the positive or negative Z-direction.

If motors M1, M2, M3 in FIG. 1 are identical, especially as far as their motor constant, thus, the force generated per unit of current, is concerned, and if the same current flows through all motors M1, M2, M3, then the total force acting on platform P is applied approximately in the middle of the platform. The platform should then move as an entirety in the desired direction without tilting. It is then sufficient to monitor the position of platform P in the Z-direction using a single position-measuring device E, and to use the position value thus ascertained for a position control loop.

In practice, however, the motors M1, M2, M3 are not distributed exactly uniformly at the periphery of platform P, and the motor constants of motors M1, M2, M3 are not completely identical. As a consequence, the resulting force is not applied exactly centrally, but rather somewhere in a certain area B. Since this area of application B surrounds center of gravity CG or a possible tilting axis L of platform P in the area of the center of gravity, it cannot be predicted whether platform P will additionally perform a tilting motion during a movement in the Z-direction. In the most unfavorable case, it may then even be impossible to control platform P using only one position-measuring device E. The reason is that if the actual point of application of the resulting force of all motors M1, M2, M3 is opposite position-measuring device E relative to tilting axis L, then this force leads to a tilting or rotation of platform P about tilting axis L, and thus, for example, to a change in position at position-measuring device E which suggests a platform P moved downwards, although the motors are exerting a force upwards, and center of gravity CG of platform P is also moving upwards. In such a case, the system would not be controllable.

This effect may already occur when the actual point of application of the force is located in a part of area B facing away from position-measuring device E, area B being split by tilting axis L which is approximately perpendicular to the connection between position-measuring device E and center of gravity CG and extends in the vicinity of center of gravity CG. This critical area is shaded in FIG. 1. With respect to encoder E, the point of application of the force of all motors M1, M2, M3 must not lie on the other side of tilting axis L.

One solution would be to provide a position-measuring device in the area of each motor M1, M2, M3 and to control each motor separately. However, this would mean considerable extra expense, since additional position-measuring devices and control loops would be necessary.

Figure 2:
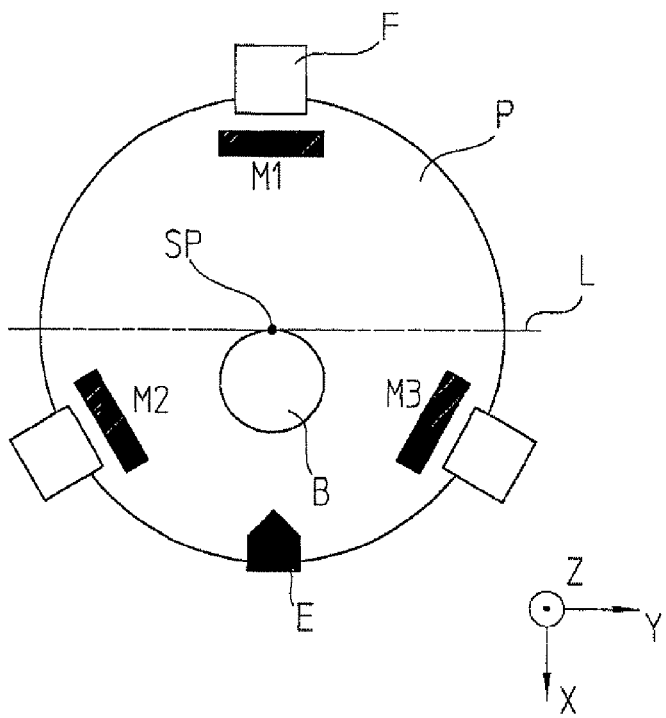

Another approach is to shift area B such that area B is located completely on the side of tilting axis L facing position-measuring device E, as shown in FIG. 2. Area B is located completely on the side of tilting axis L facing position-measuring device E. Therefore, even given a tilting of platform P, at position-measuring device E a change in the positional value is obtained which goes in the same direction as the movement of center of gravity CG of platform P. The system therefore remains controllable.

In the following, a method and a platform P are described, with which the position of area of application B may be adjusted as called for above, in doing which, the expenditure necessary for that purpose being kept low.

Figure 3:
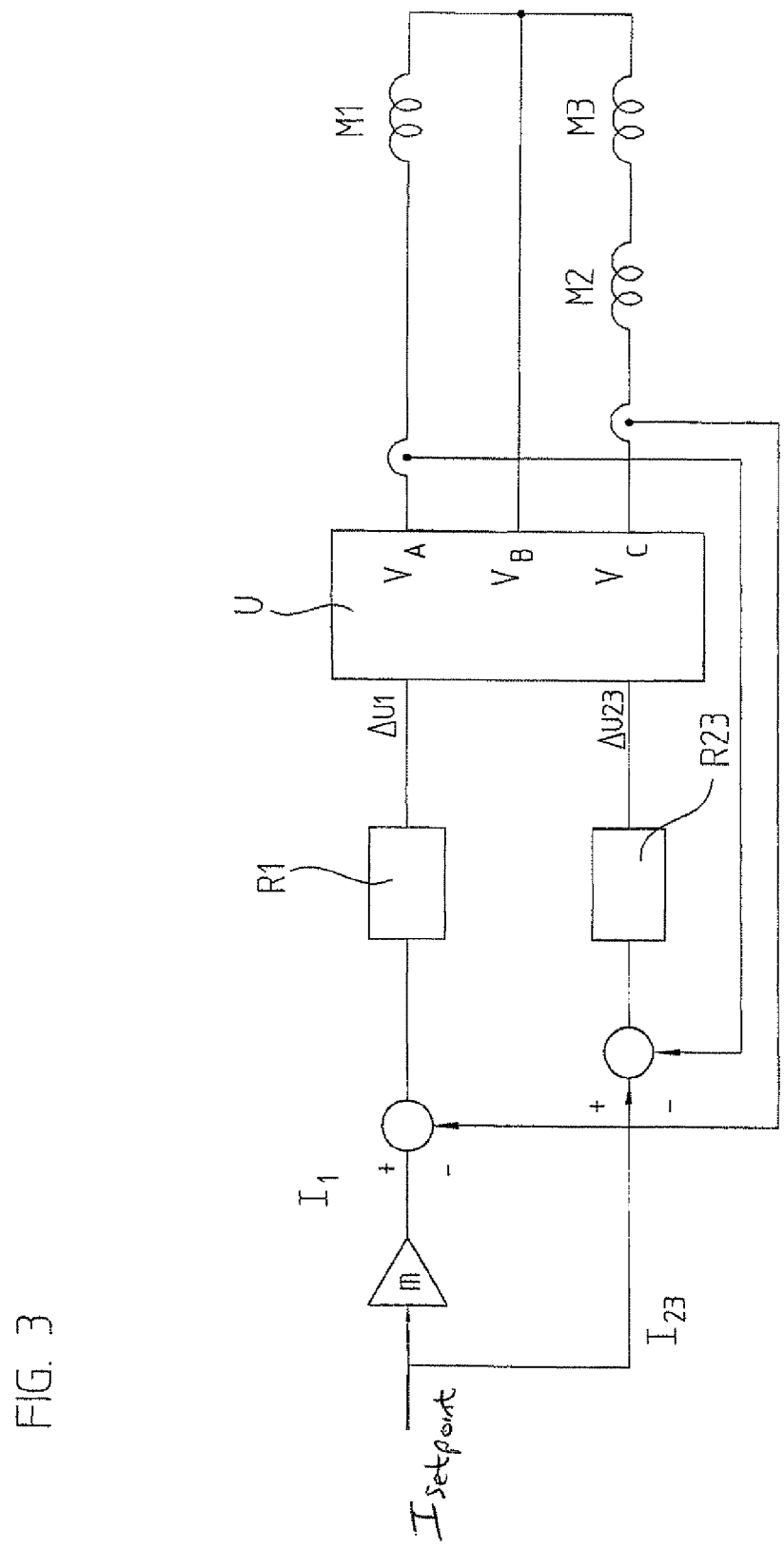
FIGS. 3 and 4 show circuit diagrams for controlling the motors.

According to FIG. 3, the three motors M1, M2, M3 are operated on one conventional three-phase converter U by operating first motor M1 between first phase $V_A$ and second phase $V_B$ of converter U, and operating a series connection of second and third motors M2, M3 between second and third phases $V_B$, $V_C$.

If one divides motors M1, M2, M3 such that the two series-connected motors M2, M3 are in the same area—split by tilting axis L—of platform P as position-measuring device E, and individually operated motor M1 is located opposite position-measuring device E (as represented in FIG. 3), it is possible to ensure that a setpoint current $I_{setpoint}$, initially intended for all motors, be passed on to converter U such that the two motors M2, M3 in each case bring about a somewhat greater force than motor M1. The required shifting of area of application B is thereby achieved.

To that end, in the exemplary embodiment illustrated in FIG. 3, setpoint current $I_{setpoint}$ for the control branch of motor M1 is multiplied by a parameterizable factor m close to one. For the case shown here, this factor m must be somewhat less than 1. The current flowing through motor M1 is then less in terms of actual amount than the current flowing through motors M2, M3, and the point of application of the force of all motors M1, M2, M3 shifts in the direction of position-measuring device E, as shown in FIG. 2.

However, if motors M1, M2, M3 are disposed such that motor M1 is located in the area of position-measuring device E, and the two other series-connected motors M2, M3 are located opposite, then factor m would have to be selected to be somewhat greater than 1 in order to achieve the desired shift of area of application B.

Two current control loops are illustrated in FIG. 3: One for slightly modified setpoint current $I_1=m*I_{setpoint}$ for motor M1, and one for setpoint current $I_{23}=I_{setpoint}$, which is intended to flow through the two motors M2 and M3. Both control loops include a PI controller R1, R23 which, based on the difference between respective setpoint currents $I_1$, $I_{23}$ and the actual currents measured in each instance, computes setpoint-voltage difference $\Delta U1$, $\Delta U23$ that is output to converter U.

The exemplary embodiment shown in FIG. 3 has the disadvantage that factor m also influences the force which is exerted altogether on platform P, since the current which flows in total through motors M1, M2, M3 also changes.

Figure 4:
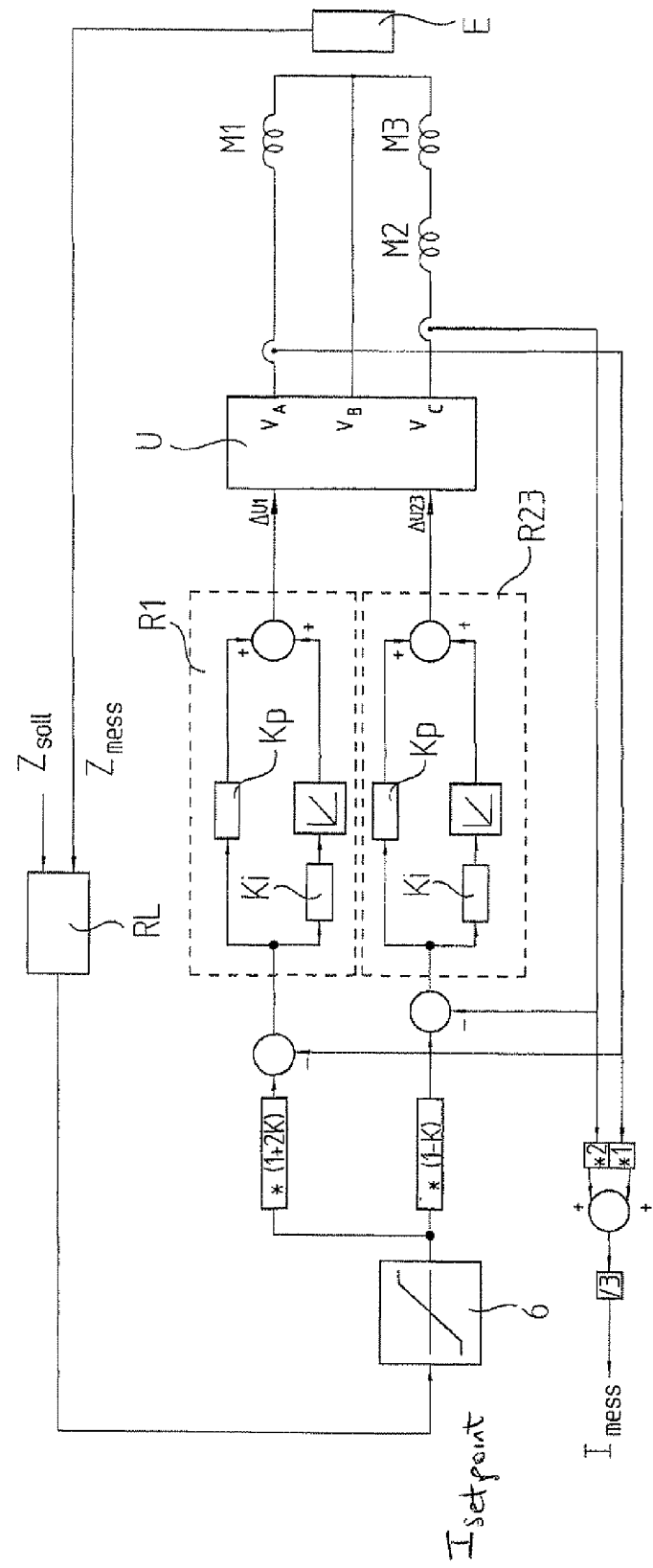

FIG. 4 shows an exemplary embodiment, which does not have this disadvantage. Here, a parameterization adapted to the special configuration of motors M1, M2, M3 is used to calculate setpoint currents $I_1$ and $I_{23}$, respectively, which ensures that the force applied altogether by motors M1, M2, M3 always corresponds to the force which is given by setpoint current $I_{setpoint}$ predefined for all motors.

FIG. 4 shows a circuit diagram for control of motors M1, M2, M3, that are connected to a converter U in the same manner as in the first exemplary embodiment. A single current setpoint value $I_{setpoint}$ is predefined. In conjunction with the approximately identical motor constant for all three motors M1, M2, M3, this current brings about a force which acts approximately centrally on platform P and is three times greater than the force of a single motor. However, because of the variance of the motor characteristics and the mounting of the motors, which is never quite exact, the precise point of application is not known; therefore, the point of application is located somewhere within area of application B.

In order now to be able to influence the individual forces so that, on one hand, the total force remains the same, and on the other hand, area of application B is situated so that the position of platform P is controllable in the Z-direction, a separate setpoint current I1 and I23, respectively, is formed for each of the two branches. The following applies:

$$I_1=I_{setpoint}*(1+2*K)$$

and $$I_{23}=I_{setpoint}*(1-K)$$

with a parameter K from the interval [−1; 1] or preferentially [−0.5; 0.5]. This means that in terms of actual amount, setpoint current $I_1$ for first motor M1 is further away, by a factor of 2, from current setpoint value $I_{setpoint}$ than setpoint current $I_{23}$ for the second and third motors. However, since setpoint current $I_{23}$ flows through two motors, but setpoint current $I_1$ flows through only one motor, the force applied in total by all three motors M1, M2, M3 is independent of parameter K.

Therefore, by suitable selection of parameter K, area of application B of the force may be shifted until it is ensured that it is located completely on the side of tilting axis L of platform P facing position-measuring device E.

Advantageously, a limiter G for current setpoint value $I_{setpoint}$ is also adapted to parameter K. Namely, if a limiting value exists for current setpoint value $I_{setpoint}$, which corresponds to current $I_{max}$ maximally permissible for one of motors M1, M2, M3, then it should be taken into account that setpoint current $I_{setpoint}$ is distributed differently to motors M1, M2, M3. If the limiting value for one motor lies at $I_{max}$, then limiter G must already limit the current setpoint value at a reduced limiting value $I_g$. The following applies:

$$I_g=I_{max}/\max((1+2*K),(1-K))$$

or $$I_g=I_{max}/\max((I_1/I_{setpoint}),(I_{23}/I_{setpoint}))$$

In this context, the function max( ) returns the largest of the passed values. Thus, the greatest current flowing in one of motors M1, M2, M3 amounts to exactly $I_{max}$, and the limitation acts the same on all motors, so that in the case of a limitation of setpoint current $I_{setpoint}$, the point of application of the force on platform P, i.e., area of application B does not change.

The setpoint currents are again fed to conventional PI controllers R1, R23. In order to obtain the same dynamic performance from all motors M1, M2, M3, amplification factors Ki and Kp of controller R23 of motors M2, M3 should be approximately twice as great as the corresponding amplification factors of controller R1.

The two controllers R1, R23 compute setpoint-voltage differences $\Delta U1$ and $\Delta U23$, respectively, which are transferred to converter U. The output voltages of the three phases $V_A$, $V_B$, $V_C$ of converter U must then be set as follows:

$$V_A=\Delta U1-0.5*\Delta U23$$

$$V_B=-0.5*\Delta U23$$

$$V_C=+0.5*\Delta U23$$

The average bus voltage of the converter, if it is not 0, must also be added to all three output voltages.

The output voltages of the three phases $V_A$, $V_B$, $V_C$ may be set with the aid of a PWM method, but other methods may also be used to set a predefined voltage, for example, linear amplifiers.

In order to furnish the user of the platform with the simplest possible, clearly understandable feedback about the current flowing in motors M1, M2, M3, the currents measured for control purposes in the two motor circuits are added, the current of the first motor being weighted one time, but the current through the two series-connected motors M2, M3 being weighted twice. The sum thus formed is then divided by three, and is displayed to the user as measurement of current $I_{mess}$ flowing in motors M1, M2, M3.

For the sake of completeness, encoder E, with which an instantaneous position $Z_{mess}$ of platform P is read, is represented schematically in FIG. 4, as well. This instantaneous position $Z_{mess}$, together with a setpoint position $Z_{soll}$, is fed to a position controller RL which calculates current setpoint value $I_{setpoint}$ from them.

Parameter K may be determined by initially ascertaining the maximum possible variance of the determining factors such as motor constants and placement of motors M1, M2, M3, and then selecting parameter K such that the controllability of the system is ensured, even under unfavorable conditions. Alternatively, the control response of the system may be studied and an appropriate setting for parameter K may be sought based on Bode diagrams, for example.

In the two previous exemplary embodiments, the two motors M2 and M3 are connected in series. However, it is also possible to connect the two motors M2, M3 in parallel between the second and third phase of the converter. Since the motors are of the same kind, the same current thus also flows in both motors.

If the second exemplary embodiment according to FIG. 4 is modified by connecting the two motors M2, M3 in parallel instead of serially between the second and third phase $V_B$, $V_C$ of converter U, changes then result in the formulas indicated for the second exemplary embodiment. For this third exemplary embodiment, not drawn separately because of the merely slight modification of FIG. 4, initially a different allocation of current setpoint value $I_{setpoint}$ applies:

$$I_1 = I_{setpoint} * (1+K)$$

and $$I_{23} = I_{setpoint} * (2-K)$$

Here, amplification factors Ki, Kp of controller R23 of motors M2, M3 should be approximately equal to corresponding amplification factors Ki, Kp of controller R1 of first motor M1.

The following applies here for limiter G and its limiting value $I_g$:

$$I_g = I_{max}/\max((1+K),(2-K)/2)$$

Exactly half of setpoint current $I_{23}$ flows in each of the two motors M2, M3.

The two controllers R1, R23 also compute setpoint-voltage differences $\Delta U1$ and $\Delta U23$ here, which are transferred to converter U. The output voltages of the three phases $V_A$, $V_B$, $V_C$ of converter U must then be set as follows:

$$V_B = -0.5 * \Delta U23, \text{ if } abs(\Delta U23) > abs(\Delta U1), \text{ or}$$

$$V_B = -0.5 * \Delta U1 \text{ otherwise, and}$$

$$V_A = V_B + \Delta U1$$

$$V_C = V_B + \Delta U23$$

In this context, the function abs( ) returns the absolute value of the passed value.

In the exemplary embodiments shown, each motor is made up of a single coil. Alternatively, however, a motor may also have a plurality of coils connected in parallel or in series.

What is claimed is:

1. A method for controlling three single-phase motors and moving a platform in a direction of a normal, comprising:
   controlling the motors by a three-phase converter including:
     operating a first motor between a first phase and a second phase of the converter; and
     operating at least one of (a) a series connection and (b) a parallel connection of a second motor and a third motor between the second phase and a third phase of the converter.

2. The method according to claim 1, further comprising:
   forming a first setpoint current for the first motor; and
   forming a second setpoint current for the second motor and the third motor.

3. The method according to claim 2, wherein a common current setpoint value predefined for all three motors determines a total force resulting from the three motors.

4. The method according to claim 3, wherein the common current setpoint value is converted into the first setpoint current and the second setpoint current to shift an area of application of the resulting force of the three motors in a direction of a position-measuring device by which a position of the platform in the direction of the normal is monitored.

5. The method according to claim 3, wherein the setpoint current of the first motor is twice as far away, in terms of absolute value, from the current setpoint value as the setpoint current for the second motor and the third motor.

6. The method according to claim 5, wherein with a parameter K from at least one of (a) an interval [−1; 1] and (b) the interval [−0.5; 0.5], the following applies for the first setpoint current and second setpoint current for a series connection of the first motor and the second motor:

$$I_1 = I_{setpoint} * (1 + 2*K)$$

and $$I_{23} = I_{setpoint} * (1-K);$$

$I_1$ representing the first setpoint current;
$I_{23}$ representing the second setpoint current; and
$I_{setpoint}$ representing the current setpoint value.

7. The method according to claim 5, wherein with a parameter K from at least one of (a) an interval [−1; 1] and (b) the interval [−0.5; 0.5], the following applies for the first setpoint current and second setpoint current for a parallel connection of the first motor and the second motor:

$$I_1 = I_{setpoint} * (1+K)$$

and $$I_{23} = I_{setpoint} * (2-K);$$

$I_1$ representing the first setpoint current;
$I_{23}$ representing the second setpoint current; and
$I_{setpoint}$ representing the current setpoint value.

8. The method according to claim 2, further comprising, based on the first setpoint current and the second setpoint current, forming, by a first current controller and a second current controller, a first setpoint voltage and a second setpoint voltage, respectively, that are to be applied to the first motor and to the at least one of (a) the series connection and (b) the parallel connection of the second motor and third motors to obtain a respective setpoint current.

9. The method according to claim 8, wherein the setpoint voltages are used for control by the three-phase converter, so that the setpoint voltage for the first motor is between the first phase and the second phase, and the setpoint voltage for the series connection of the second motor and the third motor is between the third phase and the second phase.

10. A system, comprising:
    three single-phase motors;
    a platform adjustable in a direction of a normal by the three single-phase motors; and
    a three-phase converter, a first motor connected between a first phase and a second phase of the converter, and a second motor and a third motor, connected at least one of (a) in series and (b) in parallel, between the second phase and a third phase of the converter.

11. The system according to claim 10, further comprising a single position-measurement device adapted to detect a position of the platform in the direction of the normal.

* * * * *